(12) United States Patent
Lilak et al.

(10) Patent No.: US 11,527,613 B2
(45) Date of Patent: Dec. 13, 2022

(54) REMOVAL OF A BOTTOM-MOST NANOWIRE FROM A NANOWIRE DEVICE STACK

(71) Applicant: Intel Corporation, Santa Clara, CA (US)

(72) Inventors: Aaron Lilak, Beaverton, OR (US); Patrick Keys, Portland, OR (US); Sean Ma, Portland, OR (US); Stephen Cea, Hillsboro, OR (US); Rishabh Mehandru, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/145,114

(22) Filed: Jan. 8, 2021

(65) Prior Publication Data

US 2021/0159312 A1    May 27, 2021

Related U.S. Application Data

(62) Division of application No. 16/475,031, filed as application No. PCT/US2017/025207 on Mar. 30, 2017, now Pat. No. 10,892,326.

(51) Int. Cl.
| | | |
|---|---|---|
| *H01L 29/06* | (2006.01) | |
| *H01L 21/306* | (2006.01) | |
| *H01L 21/3105* | (2006.01) | |
| *H01L 21/56* | (2006.01) | |
| *H01L 21/78* | (2006.01) | |
| *H01L 23/31* | (2006.01) | |
| *H01L 27/088* | (2006.01) | |
| *H01L 29/08* | (2006.01) | |
| *H01L 29/10* | (2006.01) | |
| *H01L 29/40* | (2006.01) | |

(Continued)

(52) U.S. Cl.
CPC .... *H01L 29/0673* (2013.01); *H01L 21/30604* (2013.01); *H01L 21/31053* (2013.01); *H01L 21/568* (2013.01); *H01L 21/7806* (2013.01); *H01L 23/3107* (2013.01); *H01L 27/0886* (2013.01); *H01L 29/0847* (2013.01); *H01L 29/1037* (2013.01); *H01L 29/401* (2013.01); *H01L 29/42392* (2013.01); *H01L 29/66795* (2013.01); *H01L 29/785* (2013.01)

(58) Field of Classification Search
CPC .................................... H01L 29/0673
See application file for complete search history.

(56) References Cited

U.S. PATENT DOCUMENTS

| | | |
|---|---|---|
| 7,692,179 B2 | 4/2010 | Islam et al. |
| 8,748,940 B1 | 6/2014 | Rachmady et al. |

(Continued)

OTHER PUBLICATIONS

International Preliminary Report on Patentability dated Oct. 10, 2019 for PCT Patent Application No. PCT/US2017/025207.

(Continued)

*Primary Examiner* — William A Harriston
(74) *Attorney, Agent, or Firm* — Finch & Maloney PLLC

(57) ABSTRACT

An apparatus is provided which comprises: a plurality of nanowire transistors stacked vertically, wherein each nanowire transistor of the plurality of nanowire transistors comprises a corresponding nanowire of a plurality of nanowires; and a gate stack, wherein the gate stack fully encircles at least a section of each nanowire of the plurality of nanowires.

20 Claims, 12 Drawing Sheets

(51) Int. Cl.
*H01L 29/423* (2006.01)
*H01L 29/66* (2006.01)
*H01L 29/78* (2006.01)

(56) References Cited

U.S. PATENT DOCUMENTS

| | | | | |
|---|---|---|---|---|
| 8,778,768 | B1* | 7/2014 | Chang | H01L 29/0673 |
| | | | | 438/303 |
| 8,785,981 | B1* | 7/2014 | Chang | H01L 29/66439 |
| | | | | 438/303 |
| 8,835,231 | B2* | 9/2014 | Bangsaruntip | H01L 29/66439 |
| | | | | 257/E21.409 |
| 9,224,810 | B2 | 12/2015 | Kim et al. | |
| 10,103,238 | B1 | 10/2018 | Zang et al. | |
| 10,411,090 | B2 | 9/2019 | Weber et al. | |
| 10,600,810 | B2 | 3/2020 | Lilak et al. | |
| 2013/0112937 | A1* | 5/2013 | Bangsaruntip | B82Y 10/00 |
| | | | | 257/E21.409 |
| 2014/0001441 | A1 | 1/2014 | Kim et al. | |
| 2014/0021538 | A1* | 1/2014 | Bangsaruntip | H01L 29/785 |
| | | | | 438/156 |
| 2014/0034908 | A1* | 2/2014 | Bangsaruntip | H01L 29/775 |
| | | | | 257/27 |
| 2014/0197377 | A1* | 7/2014 | Kim | H01L 29/66439 |
| | | | | 257/29 |
| 2014/0209855 | A1 | 7/2014 | Cea et al. | |
| 2014/0264280 | A1* | 9/2014 | Kim | H01L 29/6656 |
| | | | | 257/29 |
| 2015/0069328 | A1 | 3/2015 | Leobandung | |
| 2016/0276484 | A1 | 9/2016 | Kim et al. | |
| 2016/0293774 | A1 | 10/2016 | Then et al. | |
| 2016/0365411 | A1 | 12/2016 | Yeh et al. | |
| 2017/0040321 | A1 | 2/2017 | Mitard | |
| 2018/0108733 | A1 | 4/2018 | Augendre et al. | |
| 2019/0189785 | A1 | 6/2019 | Jambunathan et al. | |

OTHER PUBLICATIONS

International Search Report and Written Opinion for International Patent Application No. PCT/US2017/025207, dated Dec. 22, 2017.
Notice of Allowance from U.S. Appl. No. 16/475,031 notified Sep. 8, 2020, 9 pgs.
Restriction Requirement from U.S. Appl. No. 16/475,031 notified Jun. 1, 2020, 6 pgs.

* cited by examiner

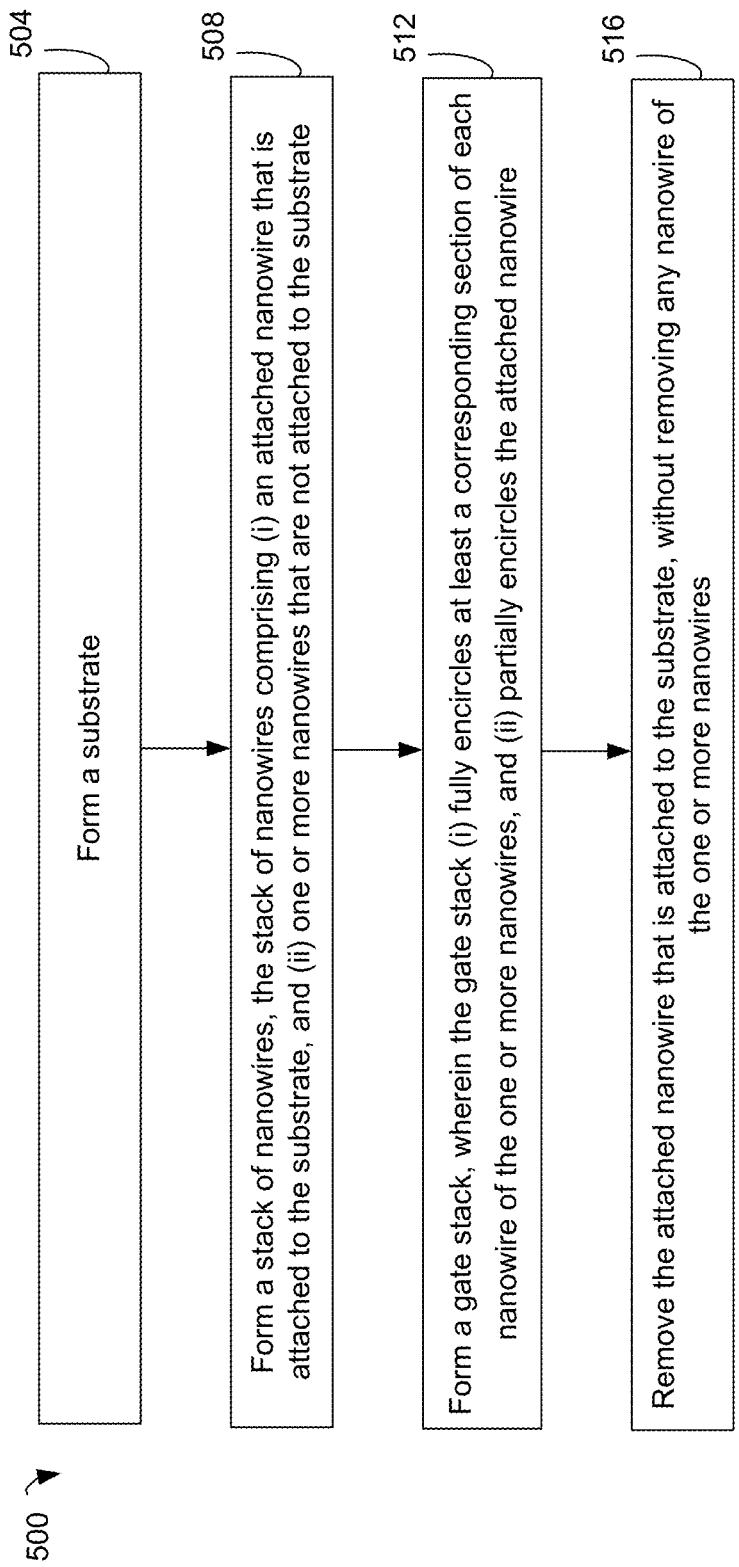

REMOVAL OF A BOTTOM-MOST NANOWIRE FROM A NANOWIRE DEVICE STACK

CLAIM FOR PRIORITY

This application is a divisional of, and claims priority to, U.S. patent application Ser. No. 16/475,031, filed Jul. 29, 2019, entitled "REMOVAL OF A BOTTOM-MOST NANOWIRE FROM A NANOWIRE DEVICE STACK," which is a National Stage Entry of, and claims priority to, PCT Application No. PCT/US2017/025207, filed on Mar. 30, 2017, entitled "REMOVAL OF A BOTTOM-MOST NANOWIRE FROM A NANOWIRE DEVICE STACK," which is incorporated by reference in its entirety.

BACKGROUND

A nanowire device, e.g., a vertical stack of nanowire transistors, may have a plurality of vertically stacked nanowires. Individual nanowires may be selectively doped to form a source region, a channel, and a drain region on the nanowire. A common gate stack or a common gate structure may serve as a gate region for the vertical stack of nanowire transistors.

In an example, for an individual nanowire, the common gate structure may be formed around at least a section of the nanowire (e.g., the common gate structure may fully encircle at least the section of the nanowire). However, the common gate structure may not fully encircle a bottom-most nanowire (e.g., a nanowire attached to or formed of a substrate on which the device is formed) of the device. In an example, because the bottom-most nanowire is not fully encircled by the common gate structure, the common gate structure may not fully be able to control or stop leakage current through or beneath the bottom-most nanowire, thereby leading to a performance degradation of the nanowire device.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5 illustrates a flowchart depicting a method for removing a bottom-most nanowire from a nanowire device, according to some embodiments.

DETAILED DESCRIPTION

Figure 1:
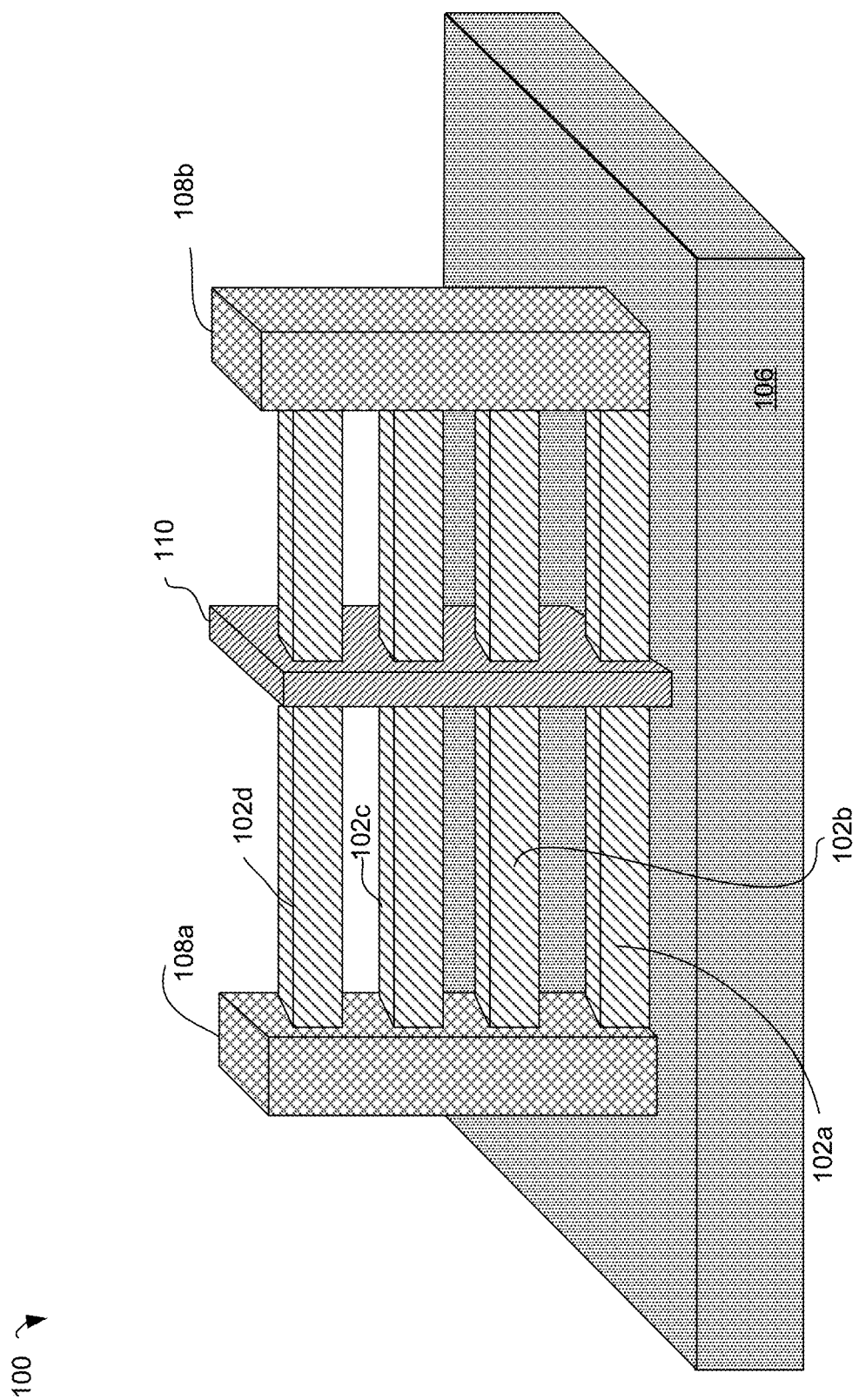
FIG. 1 schematically illustrates a nanowire device comprising a plurality of nanowires, where a bottom-most nanowire of the nanowire device is to be removed, according to some embodiments.

In some embodiments, a nanowire device may be formed, where the nanowire device may comprise a plurality of vertically stacked transistor. For example, each transistor may comprise a corresponding nanowire, where an individual nanowire may be selectively doped to form a corresponding source region, a corresponding drain region, and a corresponding channel region in the nanowire. In some embodiments, a gate stack may be formed, where the gate stack may wrap or encircle individual nanowires, or multiple nanowires.

In some embodiments, the nanowire device may be formed on a wafer or a substrate. In an example, a bottom-most nanowire of the nanowire device may be attached to the substrate. In another example, the bottom-most nanowire of the nanowire device may be formed of (and/or formed on) the substrate. In some embodiments, the gate stack may fully wrap or encircle each of the nanowires, except the bottom-most nanowire. For example, the bottom-most nanowire may not be fully encircled by the gate stack, thereby leading to a weak gate control of the bottom-most nanowire. In an example, there may be current leakage through the bottom-most nanowire.

In some embodiments, the bottom-most nanowire may be removed. For example, the nanowire device may be encapsulated by an encapsulant, which may be a gap fill material, an insulating material, a dielectric material, and/or the like. For example, the encapsulant may be formed of materials which may include, but not be limited to, silicon dioxide, silicon oxynitride, spin on silicon oxide, or similar materials. The nanowire device may be top-side bonded to a carrier wafer such that the nanowire device is held upside-down. Subsequently, the substrate or the wafer, on which the nanowire device was formed, may be removed (e.g., by etching or polishing). Subsequently, the bottom-most nanowire may be removed.

The bottom-most nanowire may be removed by one of a number of manners. In some embodiments, the bottom-most nanowire may be selectively etched to form a trench and then the trench may be filled with a gap fill material, thereby removing the bottom-most nanowire.

In another embodiment, the bottom-most nanowire may be selectively etched to form a trench and then the trench may be filled with a gap fill material, thereby removing the bottom-most nanowire. Following this, the bottom-most region of the gate stack and gate metals (e.g., which previously surrounded the bottom-most nanowire) may be removed by, for example, a wet or dry etchant.

In some other embodiments, the bottom-most nanowire may be removed by removing a section of the encapsulant that included the bottom-most nanowire. The section of the encapsulant may be removed by a chemical mechanical polishing operation, for example.

There are many technical advantages of various embodiments. For example, the bottom-most nanowire may be initially attached to the substrate. Accordingly, the gate stack may not be able to fully wrap around the nanowire. Thus, this nanowire may not be fully gated. This may result in leakage current through and beneath the bottom-most nanowire. Thus, the bottom-most nanowire may behave differently electrically from the other nanowires. The bottom wire may also be formed of a different semiconductor material (e.g., compared to the other nanowires), and hence, may exhibit different electrostatics from the other nanowires of the nanowire device. In some embodiments, the bottom-most nanowire may be removed, thereby eliminating any potential leakage through the bottom-most nanowire. Thus, each of the remaining nanowires may be fully gated, thereby minimizing or eliminating (or near eliminating) any leakage current in the nanowire device. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," end the like in the description and in the claims, if any, are used for descriptive purposes and not necessarily for describing permanent relative positions.

FIG. 1 schematically illustrates a nanowire device 100 (henceforth also referred to as device 100) comprising a plurality of nanowires 102a, 102b, 102c, and 102d, where a bottom-most nanowire 102a is to be removed, according to some embodiments. The device 100 comprises a plurality of transistors that are vertically stacked. In some embodiments, the device 100 is formed on a wafer or a substrate 106.

In some embodiments, the device 100 comprises the plurality of nanowires, e.g., nanowires 102a, . . . , 102d (generally referred to as "nanowire 102" in singular, and nanowires 102 in plural). Although four nanowires are illustrated in FIG. 1, in some embodiments, any different number of nanowires may be present in the device 100. For example, two, three, five, tens, or even hundreds of nanowires may be vertically stacked in the device 100. For example, the principles of this disclosure may be applied to a nanowire device comprising two or more nanowires.

The nanowires 102 may be nanostructures, with the diameter of the order of a nanometer ($10^{-9}$ meters), or a few nanometers (e.g., up to 20 nanometer diameter). Although various embodiments have been discussed with respect to a nanowire, the principles of this disclosure may be applied to vertically stacked wires having diameter larger than the order of a few nanometers. FIG. 1 illustrates rectangular shaped nanowires. However, in some embodiments, the nanowires 102 can have any appropriate shape, e.g., trapezoidal, oval, round, u-shaped, hourglass-shaped, or the like. In some embodiments, the nanowires 102 may include nanoribbon structures, which may be rectangular nanowires with a width that is significantly larger than a height (e.g., as measured in cross section perpendicular to the direction of current flow between a source and a drain of the device).

In some embodiments, a shape of the bottom-most nanowire 102a may differ from a shape of the other nanowires 102b . . . 102d. Merely as an example, the bottom-most nanowire 102a may have a base width (as measured in a direction parallel to the plane of the gate stack 110 and also parallel to the top surface of the substrate 106) that is larger (e.g., substantially larger) than a width of the top of nanowire 102a. Similarly, the base width of the bottom-most nanowire 102a may be larger than the width of the nanowires 102b, 102c, and/or 102d. Thus, for example, the bottom-most nanowire 102a may have a somewhat trapezoidal cross-section than the other nanowires 102b, 102c, and 102d. In an example, the nanowires 102b, 102c, and 102d may have a rectangular cross-section or another shape in cross-section. In some embodiments, the trapezoidal cross-section of the nanowire 102a may be due to an etch process involved in forming the nanowire 102a.

In some embodiments, the nanowires 102 may comprise appropriate semiconductor material, such as silicon, in an appropriate form, and/or a compound comprising silicon or another semiconductor including, but not limited to, germanium, silicon-germanium (SiGe), Gallium arsenide (GaAs), Indium gallium arsenide (InGaAs), an appropriate III-V compound semiconductor, germanium-tin, lead telluride (PbTe), an appropriate II-VI semiconductor, amorphous semiconductor materials such as indium gallium zinc oxide (IGZO), and/or the like. Accordingly, the nanowires 102 may also be referred to as silicon wires, silicon nanowires, wires or nanowires of semiconductor material, and/or the like.

In some embodiments, the bottom-most nanowire 102a is in contact with a substrate 106 on which the device 100 is formed. For example, the nanowire 102a is attached to (e.g., directly attached to, or attached to via one or more layers) the substrate 106, or formed on the substrate 106.

In some embodiments, the bottom-most nanowire 102a may be formed by removing (e.g., with an etch process) portions of substrate 106 which previously occupied the spatial volume adjacent to the nanowire 102a. In such embodiments, the bottom-most nanowire 102a may comprise the same semiconductor material as the substrate 106, and may be attached to the substrate 106. Thus, in such embodiments, the bottom-most nanowire 102a may be formed of the substrate 106.

In some embodiments, the bottom-most nanowire 102a may be formed from a different semiconductor material than the upper nanowires 102b . . . 102d and the like. Merely as an example, the bottom nanowire 102a may be formed of silicon, and the upper nanowires 102b . . . 102d and the like may be formed of germanium.

In some embodiments, the device 100 comprises a gate stack 110. As illustrated in FIG. 1, individual nanowires 102 pass through the gate stack 110. In some embodiments, the gate stack 110 fully surrounds (e.g., fully wraps around or fully encircles) at least a corresponding section of each of the nanowires 102b, 102c, and 102d. However, the nanowire 102a may not be fully surrounded (e.g., fully wrapped around or fully encircled) by the gate stack 110. For example, the nanowire 102a may be attached to the substrate 106. Thus, the gate stack 110 may surround at most three side of the nanowire 102a, but not at least a bottom side of the nanowire 102a. Because the gate stack 110 does not fully encircle the nanowire 102a, this may lead to a leakage current through the nanowire 102a. As discussed in more details herein, in some embodiments, the nanowire 102a is removed.

In some embodiments, the nanowires 102 may be appropriately doped to form source regions, drain regions, and channel regions on the nanowires. Merely as an example, the sections of the nanowires 102 on a first side (e.g., the left side) of the gate stack 110 may be doped to form a corresponding source region on each of the nanowires 102. Similarly, the sections of the nanowires 102 on a second side (e.g., the right side) of the gate stack 110 may be doped to form a corresponding drain region on each of the nanowires 102. The sections of the nanowires 102 encircled by the gate stack 110 may form a corresponding channel region on each of the nanowires 102.

In some embodiments, the device 100 may further comprise source/drain contacts 108a and 108b and gate contact to region 110. For example, the contact 108a coupled to the source regions of the nanowires 102 may form a source contact, and the contact 108b coupled to the drain regions of the nanowires 102 may form a drain contact.

In FIG. 1, the source contact 108 is a common source contact for all the nanowires 102, and similarly, the drain contact 108 is a common drain contact for all the nanowires 102. However, in some embodiments and although not illustrated in FIG. 1, the source contact 108a may be segregated or separated such that each nanowire 102 is connected to a corresponding source contact. Similar, in some embodiments and although not illustrated in FIG. 1, the drain contact 108b may be segregated or separated such that each nanowire 102 is connected to a corresponding drain contact.

In some embodiments, the nanowire 102d (e.g., along with the doped source region, the doped drain region, and the channel region on the nanowire 102d), the common gate stack 110, the source contact 108a, and the drain contact 108b may form a first transistor. In some embodiments, the nanowire 102c (e.g., along with the doped source region, the doped drain region, and the channel region on the nanowire 102c), the common gate stack 110, the source contact 108a, and the drain contact 108b may form a second transistor. Similar, another transistor may be associated with the nanowire 102b.

Thus, FIG. 1 illustrates at least three vertically stacked transistors associated with the nanowires 102b, 102c, and 102d. Although the nanowire 102a may also form a transistor, as discussed herein in further detail, the nanowire 102a may be removed from the device 102. In some embodiments and although not illustrated in FIG. 1, any different number of transistors (e.g., two, three, five, tens, or even hundreds) may be formed in the device 100.

In some embodiments, the nanowire device 100 may be formed by any appropriate techniques for forming such devices. Merely as an example, a nanowire device (e.g., such as the nanowire device 100 of FIG. 1) may be formed by alternating depositions of insulator and semiconductor layers atop a semiconductor region (e.g., semiconductor substrate 106), and subsequently forming a fin of a region where the layers are stacked. The source/drain regions may be connected, and the insulator regions between the wires may be removed by a process which may entail use of a wet chemical etch process or another means. A gate sack may be formed, where the gate stack may wrap around at least some of the nanowires. A bottom-most nanowire may be formed, as the semiconductor substrate may also be etched by the process of forming the nanowires. The bottom-most nanowire may not get a gate wrapped all the way around the nanowire. Any appropriate variation of such a process of forming a nanowire device may also be possible, and the device 100 may be formed using any appropriate techniques.

Figure 2:
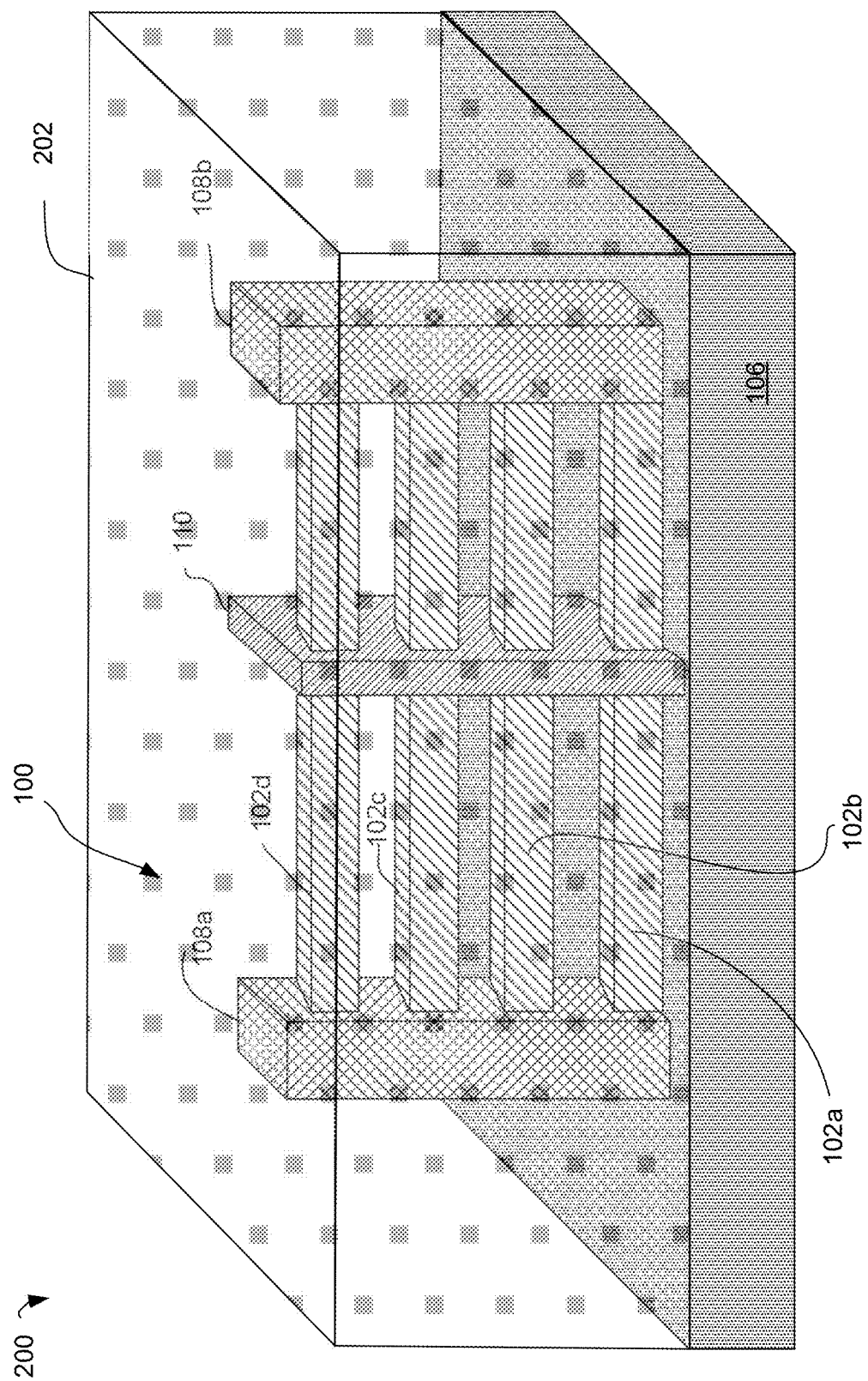
FIG. 2 schematically illustrates an encapsulant at least in part encapsulating the device of FIG. 1, according to some embodiment.

FIG. 2 schematically illustrates a device 200 comprising the device 100 of FIG. 1 being encapsulated at least in part by an encapsulant 202, according to some embodiment. In the example of FIG. 2, the encapsulant 202 is illustrated as being semi-transparent (e.g., to illustrate the device 100 within the device 200), although the encapsulant 202 is not necessarily semi-transparent. In subsequent figures, the encapsulant 202 is not illustrated to be such semi-transparent.

In some embodiments, the encapsulant 202 may comprise any appropriate insulating material (or dielectric material) covering sections of the device 100 that are formed over the substrate 106. In some embodiments, the encapsulant 202 may comprise gap fill material covering sections of the device 100 that are formed over the substrate 106. In some embodiments, the encapsulant 202 may comprise gap fill dielectric material covering sections of the device 100 that are formed over the substrate 106.

In an example, a top surface of the substrate 106 may be covered with the encapsulant 202, but the side surfaces and the bottom surface of the substrate 106 may not be covered with the encapsulant 202.

The device 200 may include interconnections (e.g., metal connections) through the encapsulant 202, e.g., to connect the source contact 108a, the drain contact 108b, the gate stack 110, etc. to components external to the device 200. However, such interconnections are not illustrated in FIG. 2 in order to not obfuscate the principles of this disclosure and also for purposes of illustrative clarity.

Figure 3A:
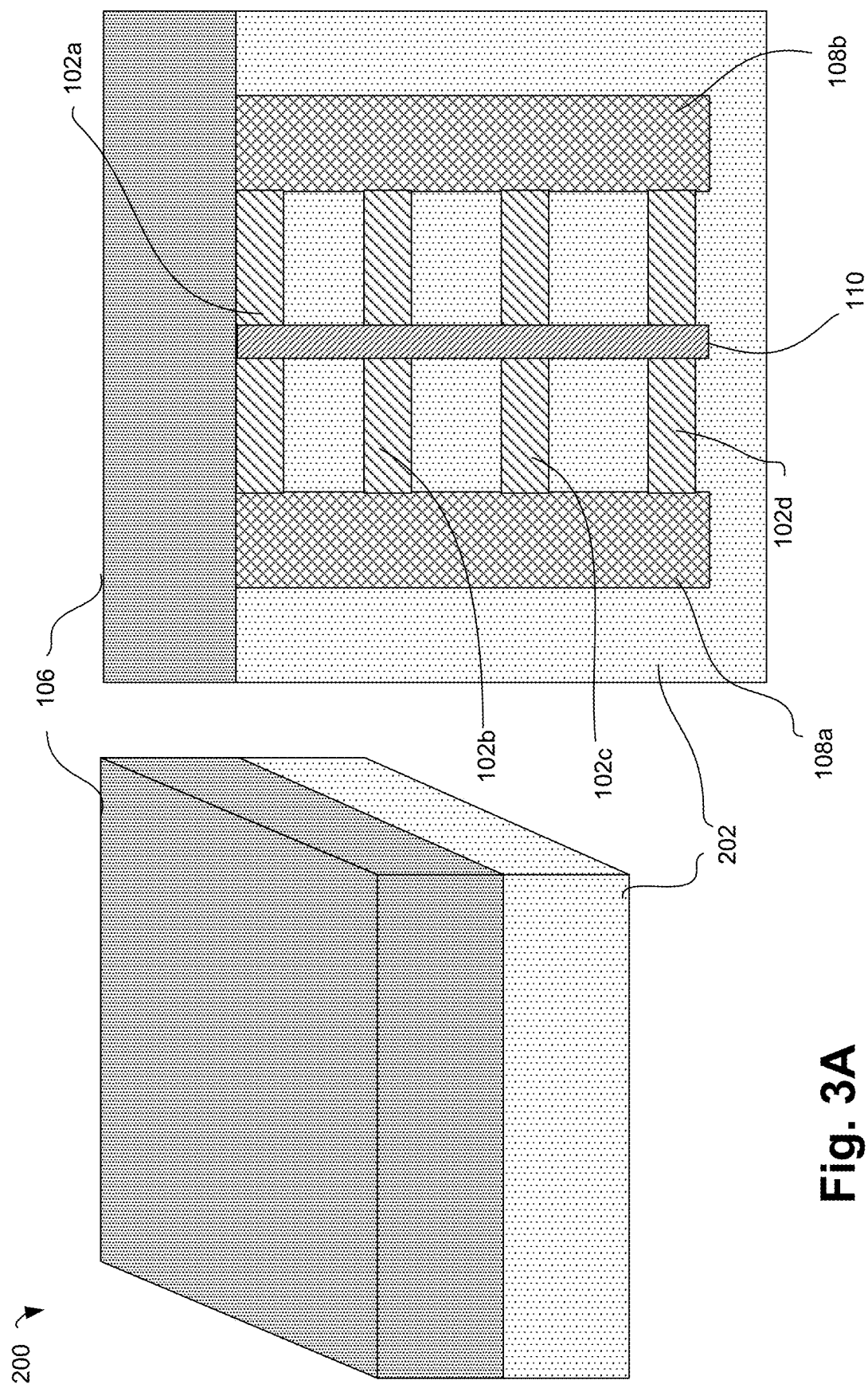
FIGS. 3A-3D schematically illustrate operations associated with removing a bottom-most nanowire from a nanowire device using at least in part backside polish operations, according to some embodiments.

FIGS. 3A-3D schematically illustrate operations associated with removing a bottom-most nanowire (e.g., nanowire 102a) from a nanowire device (e.g., the device 200 of FIG. 2), according to some embodiments. Referring to FIG. 3A, a left section of this figure illustrates a top perspective view of the device 200, and a right section of this figure illustrates a cross-sectional view of the device 200 (where the cross-sectional view may be a view that is cut along the direction of the nanowires 102). Unlike FIG. 2 where the encapsulant 202 is illustrated in a semitransparent manner for purposes of illustrative clarity, in FIG. 3 (and all subsequent figures herein) the encapsulant 202 is not illustrated in a semitransparent manner.

In FIG. 3A, the device 200 is illustrated in an upside-down manner, e.g., compared to an orientation of the device 200 in FIG. 2. For example, after the device 200 is formed (e.g., as illustrated in FIG. 2 after a front side processing of the device 200 is completed), the wafer or the substrate 106 may be top-side bonded to a carrier wafer (not illustrated in FIG. 3A) such that the device 200 is held upside-down, as illustrated in FIG. 3A. Components of FIG. 3A are similar to the corresponding components of the device 200 of FIG. 2 (for example, except for the orientation of the device 200 in FIG. 3A), and hence, FIG. 3A will not be discussed in further detail herein.

Figure 3B:
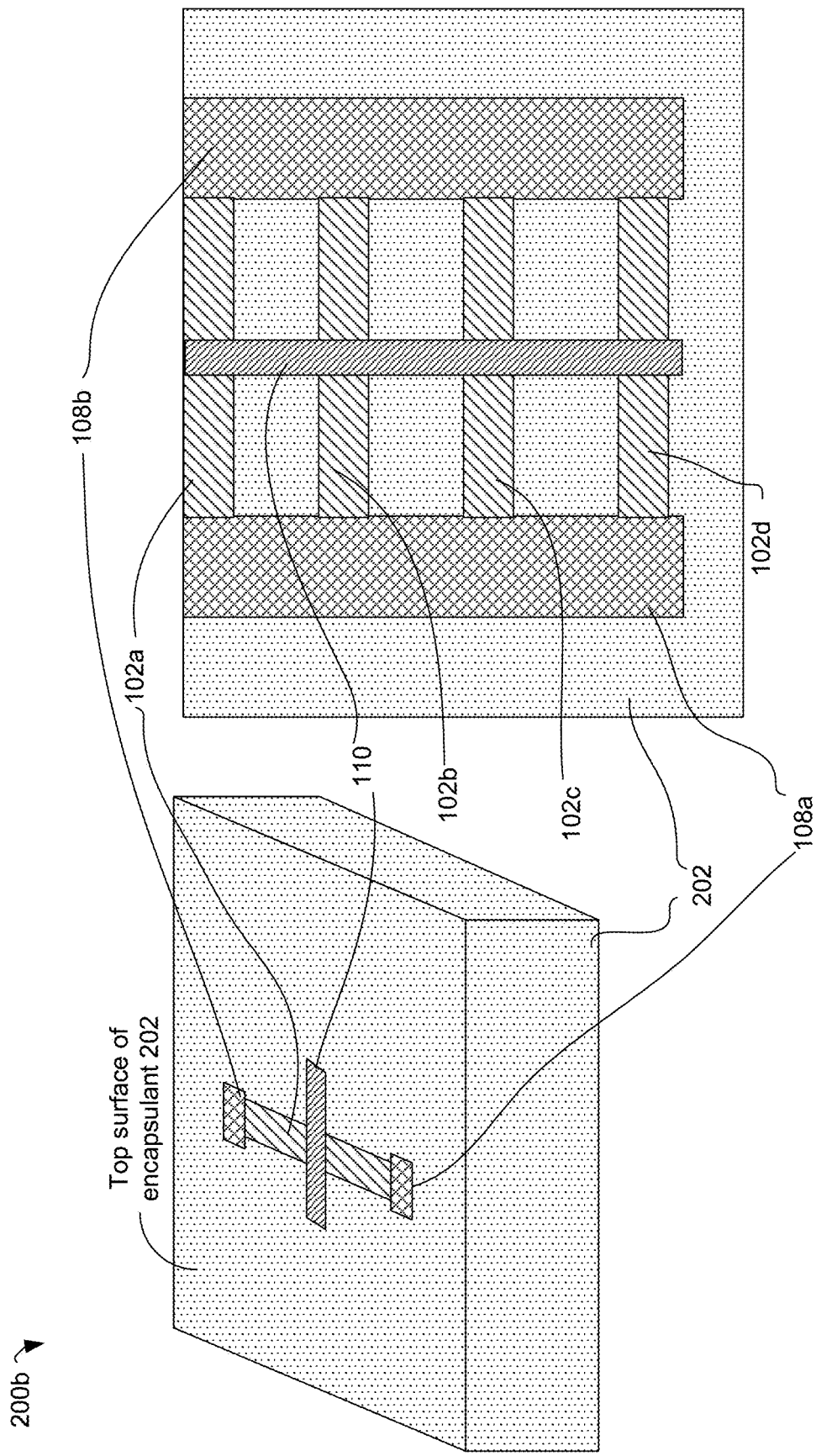

Referring now to FIG. 3B, a device 200b is formed from the device 200 of FIG. 3A. In FIG. 3B, a left section illustrates a top perspective view of the device 200b, and a right section illustrates a cross-sectional view of the device 200b.

In some embodiments, the device 200b of FIG. 3B may be formed by a backside reveal process in which the substrate 106 is removed from the device 200 of FIG. 3A. This process may remove the substrate 106 and stop once the encapsulant 202 is reached or in close proximity thereof. In some embodiments, the substrate 106 may be removed by planarizing, etching and/or polishing the substrate 106. Merely as an example, the substrate 106 may be removed using, at least in part, a Chemical Mechanical Process (CMP) or another appropriate process. In some embodiments, the removal may be selective to the substrate 106 such that the removal process may stop once the bottom-most nanowire 102a and/or the encapsulant 202 is revealed. Once the substrate 106 is removed, respective surfaces of the contacts 108a and 108b, the bottom-most nanowire 102a, and the gate stack 110 may be revealed through a top surface of the encapsulant 202.

Figure 3C:
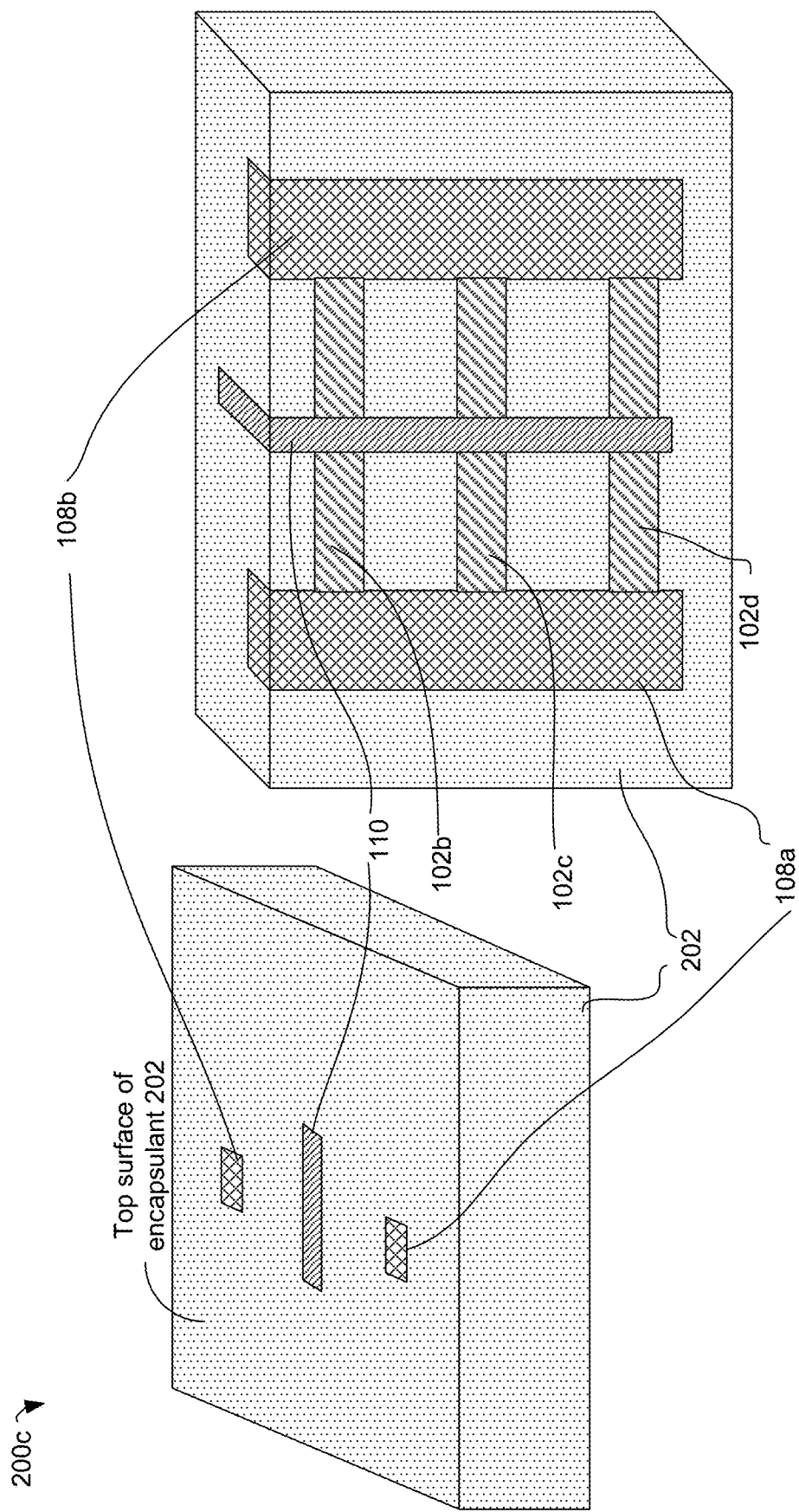

Referring now to FIG. 3C, a device 200c is formed from the device 200b of FIG. 3B. In FIG. 3C, a left section illustrates a top perspective view of the device 200c, and a right section illustrates a front perspective view of the device 200c.

In some embodiments, the device 200c of FIG. 3C may be formed by subjecting the top surface of the encapsulant 202 (e.g., as labeled in FIG. 3C) to additional polishing operation. For example, the polishing operation may remove layers or sections from the top surface of the encapsulant 202 upon which nanowire 102a may be exposed, along with fully removing the bottom-most nanowire 102a. In some embodiments, sections of the contacts 108a and 108b, and sections of the gate stack 110 may also be removed during this polish operation. For example, sections of the contacts 108a and 108b and the gate stack 110, which were adjacent to the bottom-most nanowire 102a, may also be removed.

Thus, as illustrated in the side perspective view of the right in FIG. 3C, due to the removal of the bottom-most nanowire 102a, three nanowires 102b, 102b, and 102d may remain in the device 200c. In some embodiments, the polishing operation of FIG. 3C may stop at some point between the bottom-most nanowire 102a and the second-bottom-most nanowire 102b. Thus, the bottom-most nanowire 102a (and the adjacent sections of the contacts 108a, 108b, and gate stack) may be removed in the device 200c of FIG. 3C.

In some embodiments, the removal operation discussed with respect to FIG. 3B (e.g., which removed the substrate 106) may be continued in FIG. 3C to remove the nanowire 102a and sections of the encapsulant 202. In some other embodiments, the removal operation in FIG. 3C may be different and separate from the removal operation in FIG. 3B. In some embodiments, the removal operation in FIG. 3C may be performed by appropriate polishing, etching and/or planarization processes, e.g., a CMP or another appropriate process.

Figure 3D:
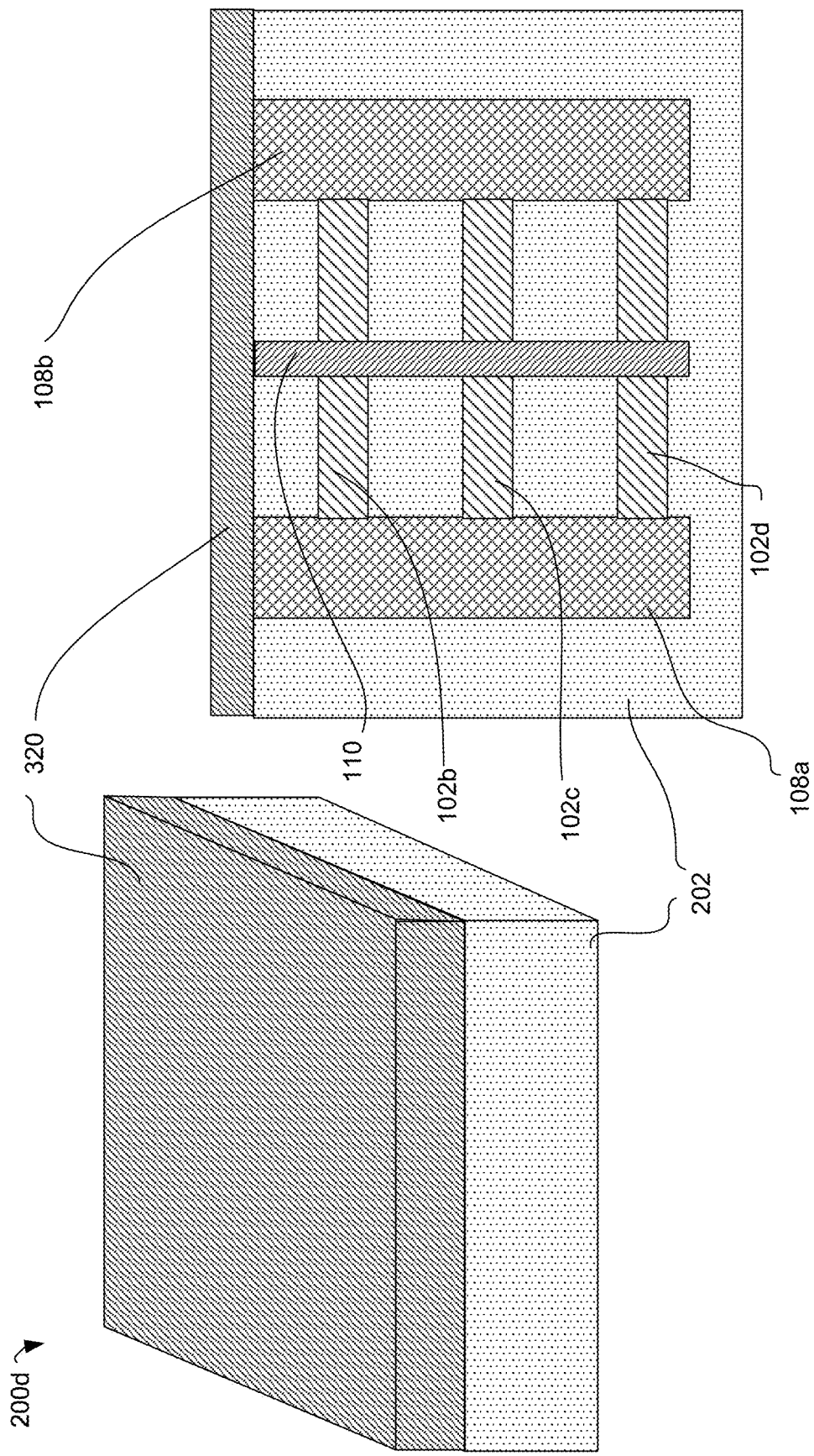

Referring now to FIG. 3D, a device 200d is formed from the device 200c of FIG. 3C. In FIG. 3D, a left section illustrates a top perspective view of the device 200d, and a right section illustrates a cross sectional view of the device 200d. In some embodiments, the device 200d may be formed by forming an insulating layer 320 on the top surface of the encapsulant 202. The insulating layer 320 may comprise an appropriate insulating material (or a dielectric material), such as silicon dioxide, silicon oxynitride, a spin-on glass or silicon dioxide material, or another appropriate insulating material.

FIGS. 3A-3D illustrate removing the nanowire 102a of the device 200 by removing at least a section of the encapsulant 202 by polishing the top surface of the encapsulant 202. FIGS. 4A-4D illustrate alternative operations to remove the nanowire 102a. FIGS. 4A-4D schematically illustrate operations associated with removing a bottom-most nanowire (e.g., nanowire 102a) from a nanowire device (e.g., device 100 of FIG. 1 or device 200 of FIG. 2) by selectively etching the bottom-most nanowire, according to some embodiments.

Figure 4A:
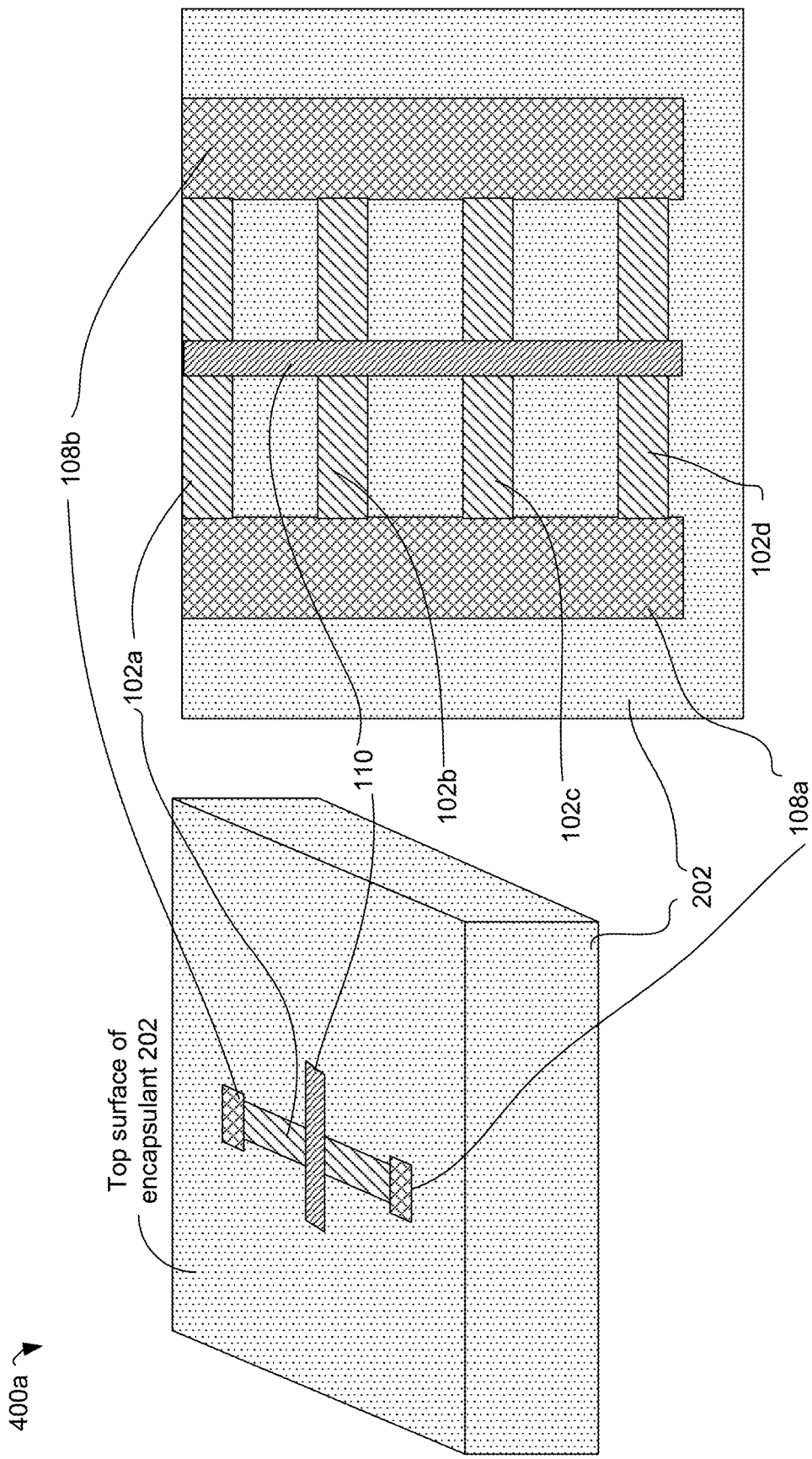
FIGS. 4A-4D schematically illustrate operations associated with removing a bottom-most nanowire from a nanowire device by at least in part selectively etching the bottom-most nanowire, according to some embodiments.

Referring to FIG. 4A, illustrated is a device 400a that is formed by removing the substrate 106 from the device 200 of FIG. 2. The device 400a of FIG. 4A is similar to the device 200b of FIG. 3B, and hence, formation of the device 400a is not discussed herein in further detail.

Figure 4B:
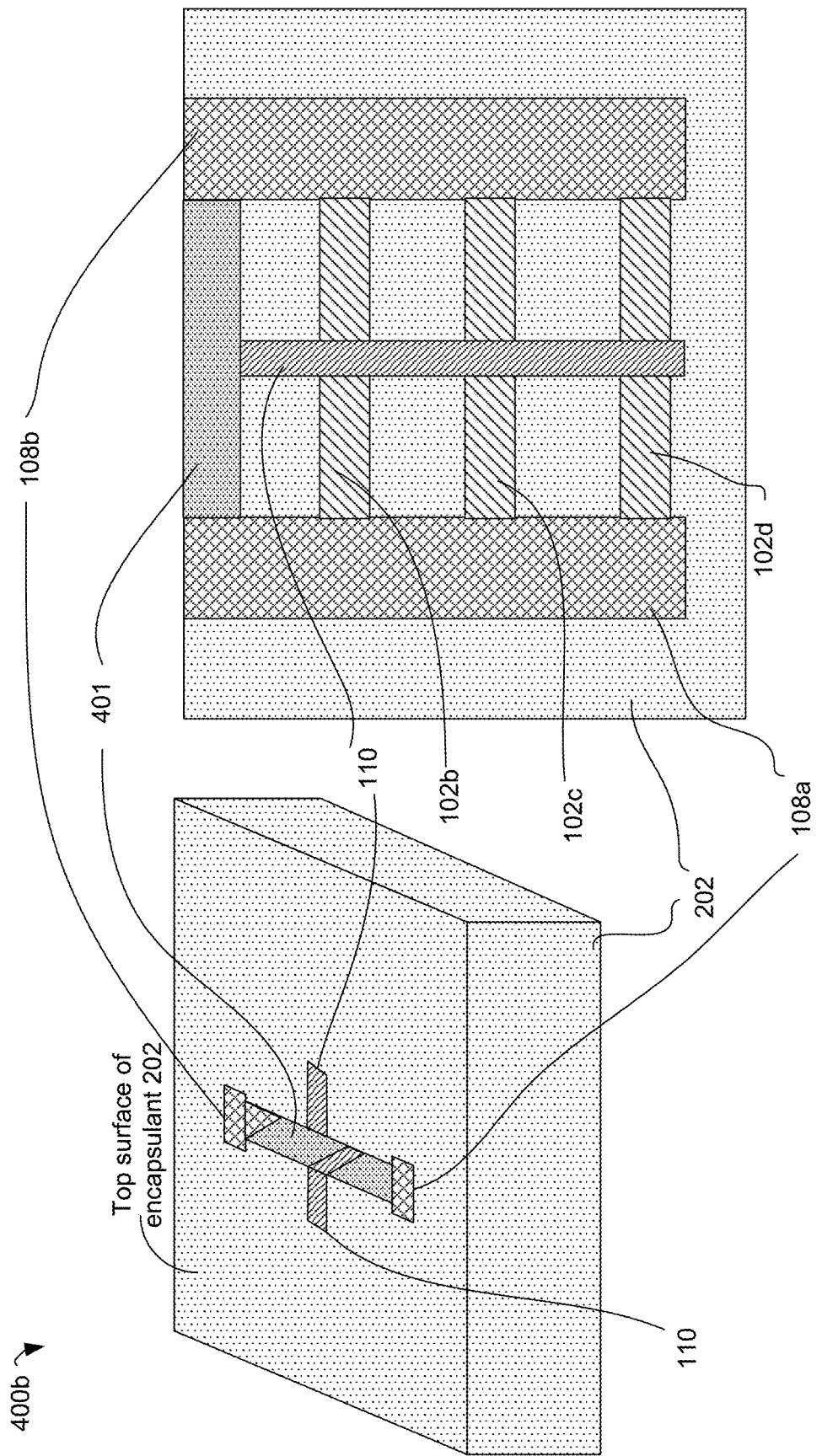

Referring now to FIG. 4B, a device 400b is formed from the device 400a of FIG. 4A. In FIG. 4B, a left section illustrates a top perspective view of the device 400b, and a right section illustrates a cross sectional view of the device 400b. In some embodiments, the device 400b may be formed by selectively removing the nanowire 102a (e.g., that was exposed through the top surface of the encapsulant 202 in FIG. 4A). In some embodiments, a trench 401 may be formed by removal of the nanowire 102a.

In some embodiments, the nanowire 102a may be removed by an etch process that may be highly selective of the semiconductor material of the nanowire 102a (e.g., compared to the material of the encapsulant 202 and/or the materials of the gate stack region 110 and the source and drain contact structures 108a and 108b). In some embodiments, subsequent to the nanowire 102a is etched to form the trench 401, further etching may be performed, e.g., in order to trim back any possible gate metal of the gate stack 110 and/or any additional metal of the source and drain contact regions 108a and 108b that may be present on the bottom-most nanowire 102a (e.g., which could otherwise lead to an increased gate capacitance).

Figure 4C:
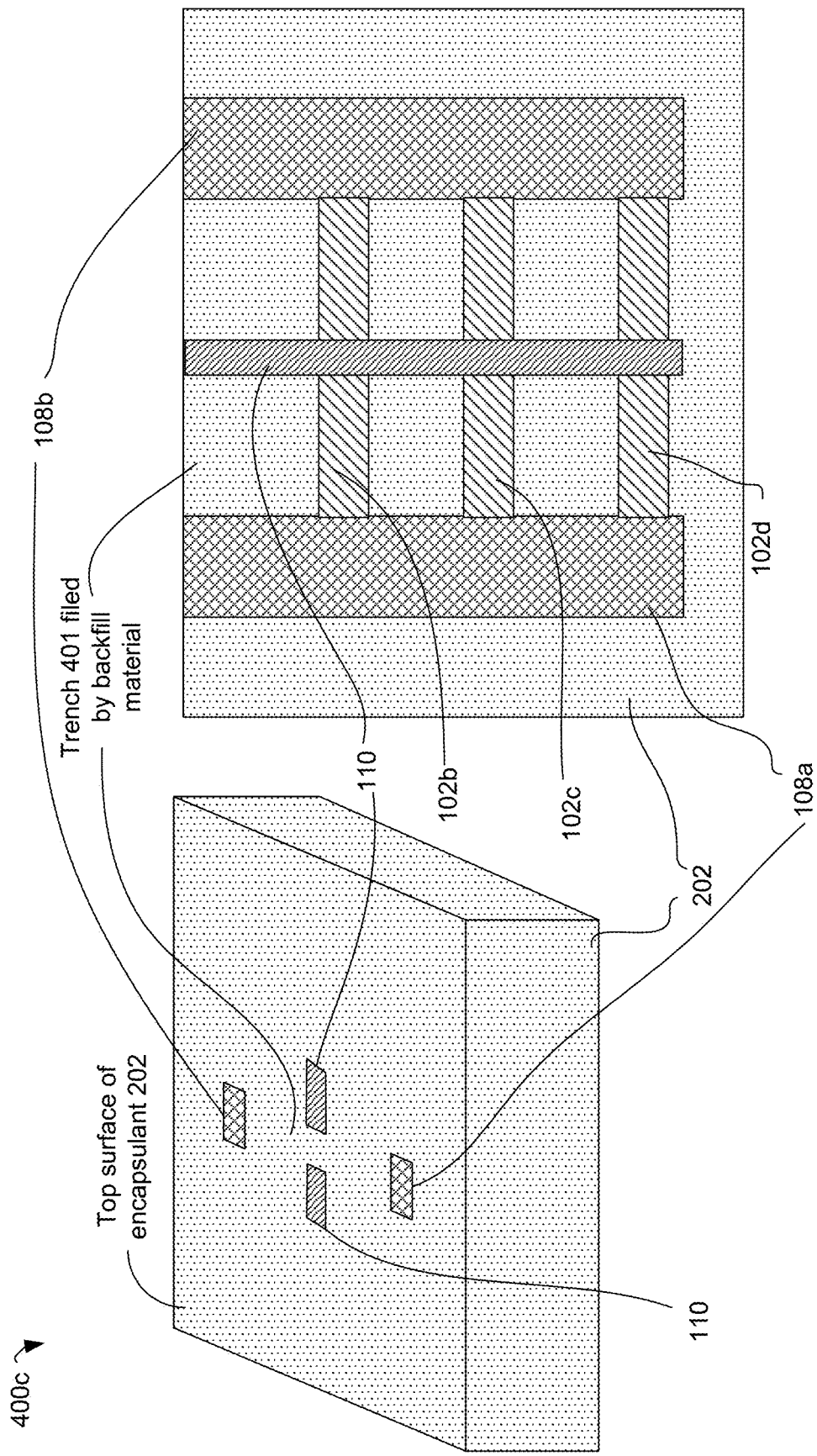

Referring now to FIG. 4C, a device 400c is formed from the device 400b of FIG. 4B. In FIG. 4C, a left section illustrates a top perspective view of the device 400c, and a right section illustrates a cross sectional view of the device 400c. In some embodiments, the device 400c may be formed by filing the trench 401 with a gapfill material, an insulating material, or a dielectric material (e.g., such as silicon oxide layer). In some embodiments, the material used for filing the trench 401 may be similar to the material of the encapsulant 202 (and hence, the material used for filing the trench 401 is not separately marked and labeled in this figure). In some embodiments, subsequent to filing the trench 401 with the gapfill material, the top surface of the encapsulant 202 may be re-planarized with a fill and polish operation.

Figure 4D:
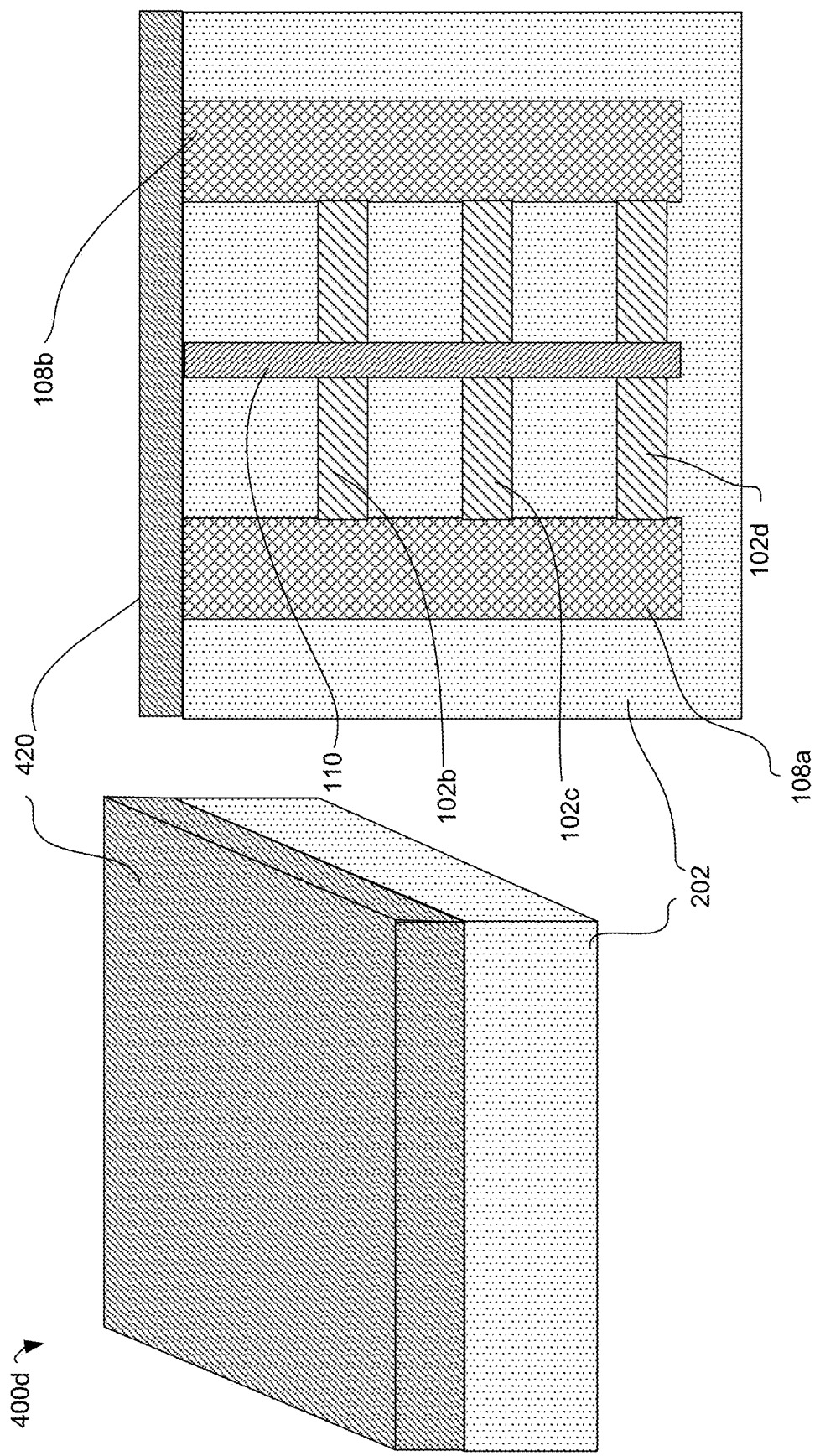

Referring now to FIG. 4D, a device 400d is formed from the device 400c of FIG. 4C. In FIG. 4D, a left section illustrates a top perspective view of the device 400d, and a right section illustrates a cross sectional view of the device 400d. In some embodiments, the device 400d may be formed by forming an insulating layer 420 on the top surface of the encapsulant 202. The insulating layer 420 may comprise an appropriate insulating material or a dielectric material.

Referring to FIGS. 3A-3D and 4A-4D, each of the devices 200d and the device 400d may be formed using multiple operations that may include at least one etch process. In some embodiments, such an etch process may introduce fixed charges upon the etched surfaces. In some embodiments, such fixed charges may be removed by an annealing process. For example, a low temperature (e.g., temperature range of about 250 C to about 500 C, or higher) hydrogen, deuterium or other ambient anneal process may be used. In an example, such a process may be performed under elevated pressure (e.g., from about 2 to about 100 atmospheres of pressure). In some embodiments, such an anneal process may be performed on a device illustrated in any of FIG. 3C, 4B or 4C.

There are many technical advantages of various embodiments. In some embodiments, the device 200d of FIG. 3D and/or the device 400d of FIG. 4D have several advantages over the device 200 of FIG. 2. For example, as discussed herein previously, the bottom-most nanowire 102a of the device 200 of FIG. 2 may be attached to the substrate 106. Accordingly, the gate stack 110 may not be able to fully wrap around the nanowire 102a. Thus, the nanowire 102a may not be fully gated. This may result in a weak control of the gate stack 110 over the nanowire 102a. This may result in leakage current, through or beneath the nanowire 102a, between the contacts 108a and 108b. Small leakage current may also occur between the contacts 108a and 108b through the substrate 106. In contrast, in the device 200b of FIG. 3B and/or the device 400a of FIG. 4A, the substrate 106 is removed, thereby eliminating any potential leakage between the contacts 108a and 108b through the substrate 106. Additionally, in the device 200d of FIG. 3D and/or the device 400d of FIG. 4D, the bottom-most nanowire 102a may be removed, thereby reducing or eliminating any potential leakage between the contacts 108a and 108b through or beneath the nanowire 102a. Thus, each of the nanowires in the devices 200d and 400d may be fully gated. For example, each of the nanowires in the devices 200d and 400d may have at least a section that is fully encircled or completely wrapped around by the gate stack 110, thereby minimizing or eliminating (or near eliminating) any leakage current in the devices 200d and 400d (or at least substantially reducing the leakage current compared to a conventional nanowire device in which the bottom-most nanowire has not been removed).

FIG. 5 illustrates a flowchart depicting a method 500 for removing a bottom-most nanowire (e.g., nanowire 102a) from a nanowire device (e.g., device 200 of FIG. 2), according to some embodiments. At 504, a substrate (e.g., substrate 106) is formed. At 508, a stack of nanowires (e.g., nanowires 102a, . . . , 102d) is formed. In some embodiments, the stack of nanowires comprises (i) an attached nanowire (e.g., nanowire 102a) that is attached to the substrate, and (ii) one or more nanowires (e.g., nanowires 102b, . . . , 102d) that are not attached to the substrate. In some embodiments, the one or more nanowires may be associated with a corresponding one or more vertically stacked transistors.

At 512, a gate stack (e.g., gate stack 110) is formed. In some embodiments, the gate stack (i) fully encircles at least a corresponding section of each nanowire of the one or more nanowires, and (ii) partially encircles the attached nanowire (e.g., as illustrated in FIGS. 1-2).

At 516, the attached nanowire (e.g., which is attached to the substrate) is removed, e.g., without removing any nanowire of the one or more nanowires. In some embodiments, the attached nanowire is removed using backside polish operations, e.g., as discussed with respect to FIGS. 3A-3D. In some other embodiments, the attached nanowire is removed by selectively etching the bottom-most nanowire, e.g., as discussed with respect to FIGS. 4A-4D.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 4 may be optional in accordance with certain embodiments. The numbering of the blocks presented is for the sake of clarity and is not intended to prescribe an order of operations in which the various blocks must occur.

Figure 6:
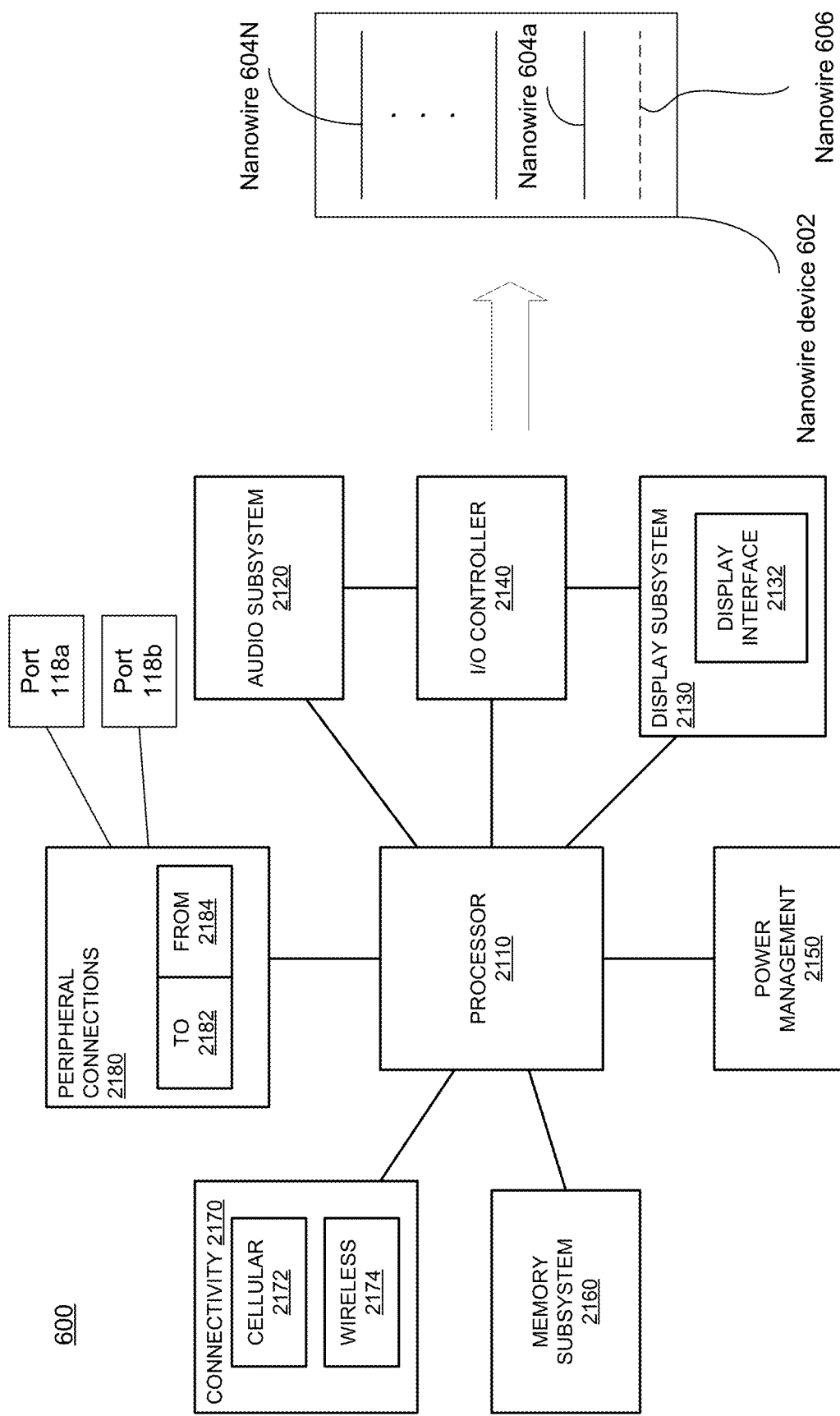
FIG. 6 illustrates a computer system, a computing device or a SoC (System-on-Chip), where one or more components of the computing device comprise nanowire devices whose bottom-most nanowire has been removed, in accordance with some embodiments.

FIG. 6 illustrates a computer system, a computing device or a SoC (System-on-Chip) 2100, where one or more components of the computing device 2100 comprise nanowire devices whose bottom-most nanowire has been removed, in accordance with some embodiments. It is pointed out that those elements of FIG. 6 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing device 2100 (e.g., the processor 2110, a memory in the memory subsystem 2160, and/or the like) comprises nanowire devices, e.g., vertically stacked transistors comprising nanowires. Illustrated in FIG. 6 is an example nanowire device 602, which may be a vertical stack of transistors, where each transistor comprises a corresponding nanowire of a plurality of nanowires 604*a*, . . . , 604N (e.g., similar to the nanowire device 200*d* of FIG. 3D or the nanowire device 400*d* of FIG. 4D). In some embodiments, the nanowire device 602 is formed in accordance with various embodiments discussed herein (e.g., using operations illustrated in FIGS. 3A-3D and/or using operations illustrated in FIGS. 4A-4D). For example, a bottom-most nanowire 606 (illustrated using dotted line in FIG. 6 and which may be present while forming the device 602) may be removed and may not be present in the device 602 after the device 602 is formed, as discussed herein. As a result, each of the nanowires 604 may have at least a section that is fully wrapped or encircled by a gate stack. Thus, each of the nanowires 604 may be fully gated by the gate stack.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An apparatus comprising: a plurality of nanowire transistors stacked vertically, wherein at least one nanowire transistor of the plurality of nanowire transistors comprises a corresponding nanowire of a plurality of nanowires; and a gate stack, wherein the gate stack fully encircles at least a section of each nanowire of the plurality of nanowires.

Clause 2. The apparatus of clause 1, wherein: at least a section of the apparatus is initially formed on a substrate; an attached nanowire is initially attached to the substrate; the plurality of nanowires excludes the attached nanowire; and the attached nanowire is removed while forming the apparatus.

Clause 3. The apparatus of clause 2, wherein the substrate is removed while forming the apparatus.

Clause 4. The apparatus of clause 2, wherein none of the plurality of nanowires is attached to the substrate.

Clause 5. The apparatus of any of clauses 1-3, wherein a first nanowire of the plurality of nanowires comprises: a source region coupled to a source contact; a drain region coupled to a drain contact; and a channel region between the source region and the drain region, wherein at least a section of the channel region is fully encircled by the gate stack.

Clause 6. A method comprising: forming a substrate; forming a stack of nanowires, the stack of nanowires comprising an attached nanowire that is attached to the substrate, and one or more nanowires that are not attached to the substrate; forming a gate stack, wherein the gate stack fully encircles at least a corresponding section of each nanowire of the one or more nanowires, and partially encircles the attached nanowire; and removing the attached nanowire that is attached to the substrate, without removing any nanowire of the one or more nanowires.

Clause 7. The method of clause 6, further comprising: encapsulating the stack of nanowires within an encapsulant.

Clause 8. The method of clause 7, wherein removing the attached nanowire comprises: removing the substrate to reveal the attached nanowire through the encapsulant; removing the attached nanowire to form a trench within the encapsulant; and filling the trench with a gap fill material.

Clause 9. The method of clause 8, wherein removing the attached nanowire further comprises: selectively etching the attached nanowire, without substantially etching the encapsulant, to form the trench within the encapsulant.

Clause 10. The method of clause 7, wherein removing the attached nanowire comprises: removing the substrate to reveal the attached nanowire through the encapsulant; and removing a section of the encapsulant that includes the attached nanowire, thereby removing the attached nanowire.

Clause 11. The method of clause 10, wherein removing the section of the encapsulant comprises: removing the section of the encapsulant using a polishing operation.

Clause 12. The method of any of clauses 7-11, further comprising: annealing the encapsulant under elevated temperature to remove fixed charged potentially accumulated on the encapsulant.

Clause 13. The method of any of clauses 6-12, wherein removing the attached nanowire comprises: removing the attached nanowire to prevent any leakage current through the attached nanowire due to the gate stack partially encircling the attached nanowire.

Clause 14. A method comprising: forming a substrate; and forming a plurality of nanowires, wherein a bottom-most nanowire of the plurality of nanowires is attached to the substrate; and removing the bottom-most nanowire.

Clause 15. The method of clause 14, further comprising: forming a common gate stack, wherein the bottom-most nanowire is not fully wrapped by the common gate stack prior to the bottom-most nanowire being removed.

Clause 16. The method of any of clauses 14-15, further comprising: encapsulating the plurality of nanowires using an insulating layer.

Clause 17. The method of clause 16, wherein removing the bottom-most nanowire comprises: removing the substrate via a backside reveal process in which the bottom-most nanowire is exposed through the insulating layer; selectively etching the bottom-most nanowire to form a trench, without substantially etching the insulating layer; and filling the trench with a gap fill material.

Clause 18. The method of clause 16, wherein removing the bottom-most nanowire comprises: removing the substrate via a backside reveal process in which the bottom-most nanowire is exposed through the insulating layer; and polishing the insulating layer to remove a section of the encapsulating that included the bottom-most nanowire, thereby removing the bottom-most nanowire.

Clause 19. The method of any of clauses 15-18, wherein the plurality of nanowires comprises a first nanowire that is different from the bottom-most nanowire, and wherein the method further comprises: selectively doping the first nanowire to form a source region, a drain region, and a channel region, wherein the common gate stack fully wraps at least a section of the channel region of the first nanowire.

Clause 20. The method of any of clauses 14-19, wherein removing the bottom-most nanowire comprises: removing the bottom-most nanowire to prevent any leakage current through the bottom-most nanowire due to the common gate stack failing to fully wrap the bottom-most nanowire.

Clause 21. A system comprising: a memory to store instructions; and a processor coupled to the memory, where one of the memory or the processor comprises: a plurality of nanowire transistors stacked vertically on a substrate, wherein the plurality of nanowire transistors comprises a corresponding plurality of nanowires, and wherein none of the plurality of nanowires is attached to the substrate.

Clause 22. The system of clause 21, wherein the plurality of nanowire transistors comprises: a gate stack that is common to the plurality of nanowire transistors.

Clause 23. The system of clause 22, wherein the plurality of nanowire transistors comprises: a first transistor including a first nanowire comprising: a source region coupled to a source contact, a drain region coupled to a drain contact, and a channel region between the source region and the drain region, wherein at least a section of the channel region is fully encircled by the gate stack.

Clause 24. The system of any of clauses 21-22, wherein: the substrate is a first substrate; the plurality of nanowire transistors is initially formed on a second substrate, a first nanowire is initially attached to the second substrate while forming the plurality of nanowire transistors, the plurality of nanowires excluding the first nanowire; and the first nanowire initially attached to the second substrate is removed while forming the plurality of nanowire transistors.

Clause 25. The system of any of clauses 21-24, further comprising: a wireless interface coupled to the processor, the wireless interface to transmit and receive signals wirelessly.

Clause 26. A system comprising: a memory to store instructions; and a processor coupled to the memory, where one of the memory or the processor comprises: a plurality of nanowire transistors stacked vertically, wherein the plurality of nanowire transistors is initially formed on a substrate, wherein a first nanowire is initially attached to the substrate while forming the plurality of nanowire transistors, and wherein the first nanowire initially attached to the substrate is removed while forming the plurality of nanowire transistors.

Clause 27. The system of clause 26, wherein the plurality of nanowire transistors comprises: a gate stack that is common to the plurality of nanowire transistors.

Clause 28. The system of clause 27, wherein the plurality of nanowire transistors comprises: a first transistor including a second nanowire that is different from the first nanowire, wherein the second nanowire comprises: a source region coupled to a source contact, a drain region coupled to a drain contact, and a channel region between the source region and the drain region, wherein at least a section of the channel region is fully encircled by the gate stack.

Clause 29. The system of any of clauses 26-28, wherein the first nanowire initially attached to the substrate is removed subsequent to removing the substrate.

Clause 30. The system of any of clauses 26-29, further comprising: a wireless interface coupled to the processor, the wireless interface to transmit and receive signals wirelessly.

Clause 31. An apparatus comprising: means for forming a substrate; means for forming a stack of nanowires, the stack of nanowires comprising an attached nanowire that is attached to the substrate, and one or more nanowires that are not attached to the substrate; means for forming a gate stack, wherein the gate stack fully encircles at least a corresponding section of each nanowire of the one or more nanowires, and partially encircles the attached nanowire; and means for removing the attached nanowire that is attached to the substrate, without removing any nanowire of the one or more nanowires.

Clause 32. The apparatus of clause 31, further comprising: means for encapsulating the stack of nanowires within an encapsulant.

Clause 33. The apparatus of clause 32, wherein the means for removing the attached nanowire comprises: means for removing the substrate to reveal the attached nanowire through the encapsulant; means for removing the attached nanowire to form a trench within the encapsulant; and means for filling the trench with a gap fill material.

Clause 34. The apparatus of clause 33, wherein the means for removing the attached nanowire further comprises: means for selectively etching the attached nanowire, without substantially etching the encapsulant, to form the trench within the encapsulant.

Clause 34. The apparatus of clause 32, wherein the means for removing the attached nanowire comprises: means for removing the substrate to reveal the attached nanowire through the encapsulant; and means for removing a section of the encapsulant that includes the attached nanowire, thereby removing the attached nanowire.

Clause 35. The apparatus of clause 10, wherein the means for removing the section of the encapsulant comprises: means for removing the section of the encapsulant using a polishing operation.

Clause 36. The apparatus of any of clauses 32-35, further comprising: means for annealing the encapsulant under elevated temperature to remove fixed charged potentially accumulated on the encapsulant.

Clause 37. The apparatus of any of clauses 31-36, wherein the means for removing the attached nanowire comprises: means for removing the attached nanowire to prevent any leakage current through the attached nanowire due to the gate stack partially encircling the attached nanowire.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
   forming a stack of nanowires, the stack of nanowires comprising a nanowire that is attached to a substrate, and one or more nanowires that are not attached to the substrate;
   forming a gate stack, wherein the gate stack wraps around at least a corresponding section of each nanowire of the one or more nanowires, and partially wraps around the attached nanowire; and
   removing the nanowire that is attached to the substrate, without removing any nanowire of the one or more nanowires.

2. The method of claim 1, comprising:
   encapsulating the stack of nanowires within an encapsulant, wherein removing the attached nanowire comprises:
   removing the substrate to reveal the attached nanowire through the encapsulant;
   removing the attached nanowire to form a trench within the encapsulant; and
   filling the trench with a gap fill material.

3. An apparatus comprising:
   a layer comprising a dielectric material;
   a source region and a drain region;
   one or more bodies comprising semiconductor material extending from the source region to the drain region, the one or more bodies stacked vertically above the layer;
   a gate stack at least in part wrapping around at least one body of the one or more bodies; and
   a dielectric structure on the layer, wherein the gate stack is on two or more surfaces of the dielectric structure.

4. The apparatus of claim 3, wherein the dielectric structure has a bottom surface, a top surface opposite the bottom surface, and one or more side surfaces between the top and bottom surfaces, wherein the gate stack is on the top and side surfaces of the dielectric structure, and wherein the bottom surface of the dielectric structure is on the layer.

5. The apparatus of claim 3, wherein the gate stack contacts multiple surfaces of the dielectric structure but not all surfaces of the dielectric structure, and the layer contacts at least one other surface of the dielectric structure.

6. The apparatus of claim 3, wherein the gate stack is on three sides of the dielectric structure, and a fourth side of the dielectric structure is on the layer.

7. The apparatus of claim 3, wherein the dielectric structure extends laterally between the source and drain regions.

8. The apparatus of claim 3, wherein none of the one or more bodies is in direct contact with the layer.

9. The apparatus of claim 3, wherein the gate stack fully wraps around at least a corresponding section of each body of the one or more bodies.

10. The apparatus of claim 3, wherein the one or more bodies comprises a plurality of vertically stacked nanoribbons or a plurality of vertically stacked nanowires.

11. The apparatus of claim 3, wherein the layer and the dielectric structure are compositionally different and/or distinct from one another.

12. The apparatus of claim 3, wherein the structure comprises a dielectric material.

13. The apparatus of claim 3, wherein the apparatus is part of a processor.

14. The apparatus of claim 13, wherein the processor is coupled to a memory.

15. A system comprising:
    a memory;
    an antenna; and
    a processor coupled to the memory and the antenna, the processor including a device comprising
    a source region and a drain region,
    one or more bodies comprising semiconductor material extending from the source region to the and drain region,
    a gate stack at least in part wrapping around each body of the one or more bodies, and
    a dielectric structure including a first surface, a second surface, and one or more side surfaces between the first and second surfaces, wherein the gate stack is on the first surface and the one or more side surfaces of the dielectric structure, and not on the second surface of the dielectric structure.

16. The system of claim 15, wherein the device further comprises:
    a layer comprising a dielectric material,
    wherein the one or more bodies are above the layer and not in direct contact with the layer, and wherein the second surface of the dielectric structure is on the layer.

17. The system of claim 15, wherein the dielectric structure is compositionally distinct from the layer.

18. The system of claim 15, wherein the device further comprises:
    a dielectric layer on one or more sides of the gate stack, wherein the dielectric layer and the dielectric structure are compositionally the same.

19. The system of claim 15, wherein the gate stack fully wraps around a corresponding section of each body of the one or more bodies, and the gate stack partially and not fully wraps around a corresponding section of the dielectric structure.

20. The system of claim 15, wherein the one or more bodies comprises a plurality of vertically stacked nanoribbons or nanowires.

* * * * *